(12) United States Patent
Murofushi et al.

(10) Patent No.: US 9,368,696 B1
(45) Date of Patent: Jun. 14, 2016

(54) LIGHT EMITTING DEVICE

(71) Applicant: Sanken Electric Co., LTD., Niiza-shi, Saitama (JP)

(72) Inventors: Hitoshi Murofushi, Niiza (JP); Kazuyoshi Haga, Niiza (JP); Yoshinori Tanaka, Niiza (JP); Yuichi Sato, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/746,977

(22) Filed: Jun. 23, 2015

(30) Foreign Application Priority Data

May 18, 2015 (JP) .................... 2015-100664

(51) Int. Cl.
*H01L 33/50* (2010.01)
*H01L 33/08* (2010.01)
*H01L 33/52* (2010.01)

(52) U.S. Cl.
CPC .............. *H01L 33/504* (2013.01); *H01L 33/08* (2013.01); *H01L 33/50* (2013.01); *H01L 33/501* (2013.01); *H01L 33/52* (2013.01)

(58) Field of Classification Search
None
See application file for complete search history.

(56) References Cited

U.S. PATENT DOCUMENTS

2011/0058369 A1* 3/2011 Imamura ............. H01L 25/0753
362/231

FOREIGN PATENT DOCUMENTS

JP 2008-034186 A 2/2008
JP 2011-192738 A 9/2011

* cited by examiner

*Primary Examiner* — Armando Rodriguez
(74) *Attorney, Agent, or Firm* — Banner & Witcoff, Ltd.

(57) ABSTRACT

A light emitting device includes: a first blue light emitting element and a second blue light emitting element, peak wavelengths of which are different from each other, and a fluorescent substance layer comprising: a green fluorescent substance, which is excited by emission lights from the first blue light emitting element and the second blue light emitting element to emit green lights having emission spectrums having a first wavelength indicating a first intensity and a second wavelength indicating a second intensity smaller than the first intensity, respectively; and a red fluorescent substance, which has an absorption spectrum in which absorption is less in the second wavelength than in the first wavelength and which is excited by the emission lights from the first blue light emitting element and the second blue light emitting element to emit red lights.

5 Claims, 15 Drawing Sheets

FIG.5
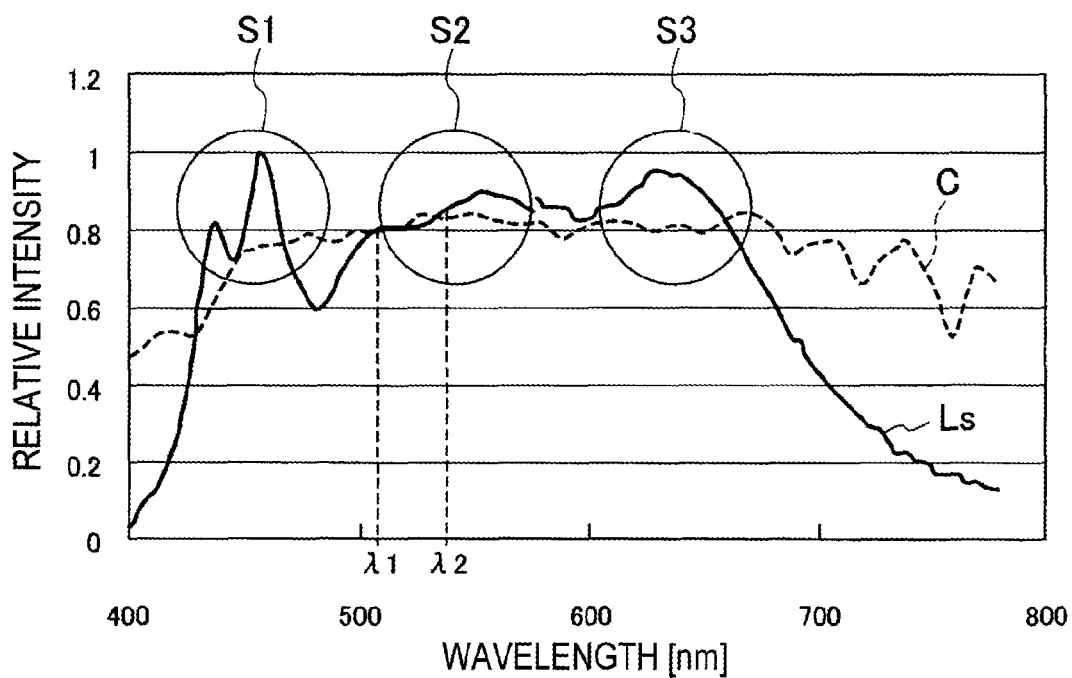
FIG.6 -COMPARATIVE EXAMPLE-
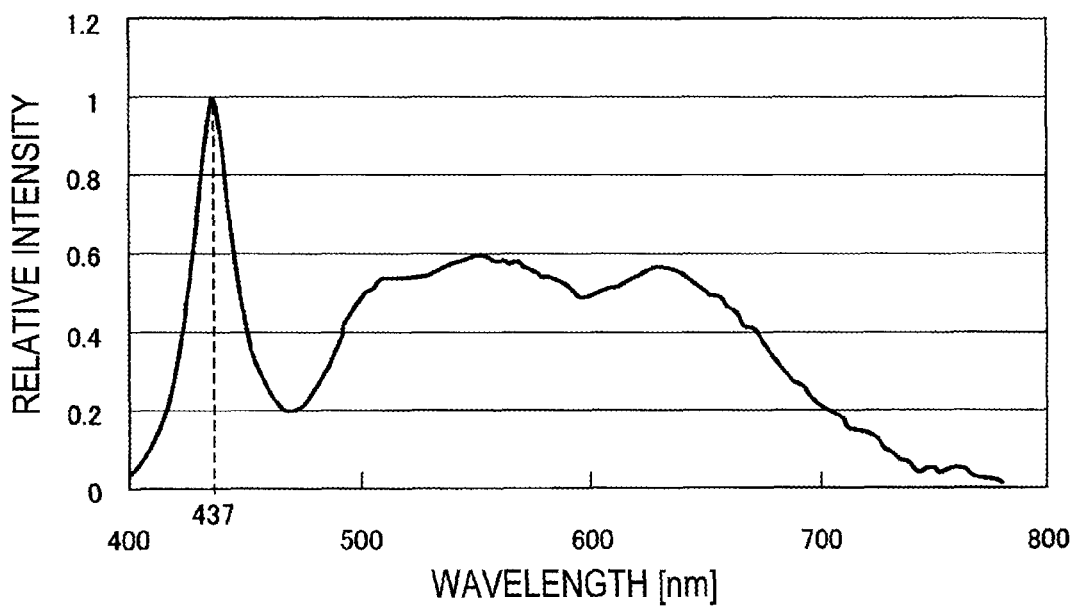

FIG.7 -COMPARATIVE EXAMPLE-
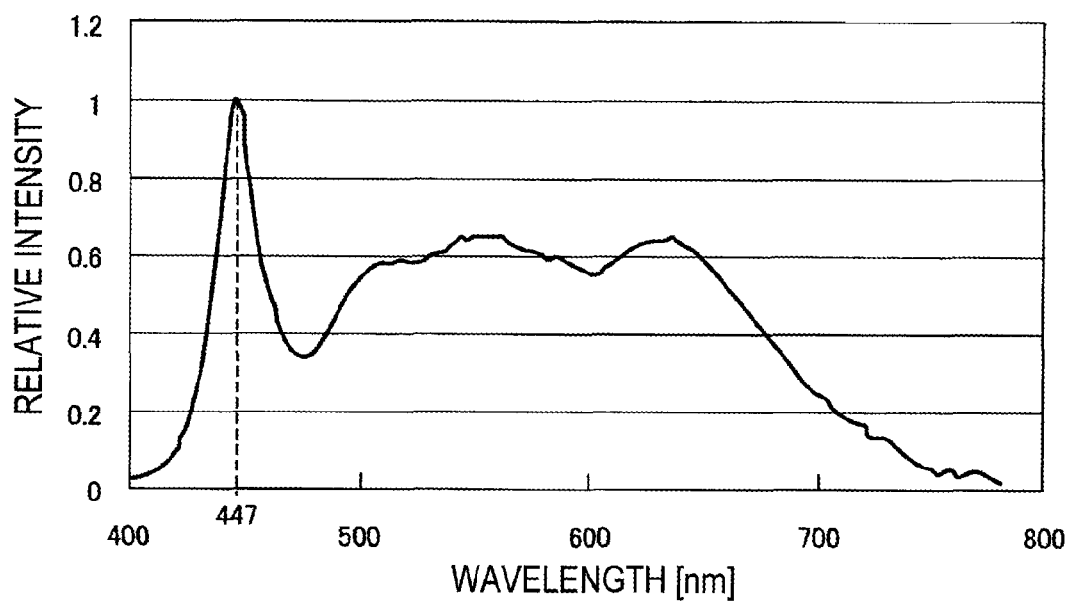
FIG.8 -COMPARATIVE EXAMPLE-
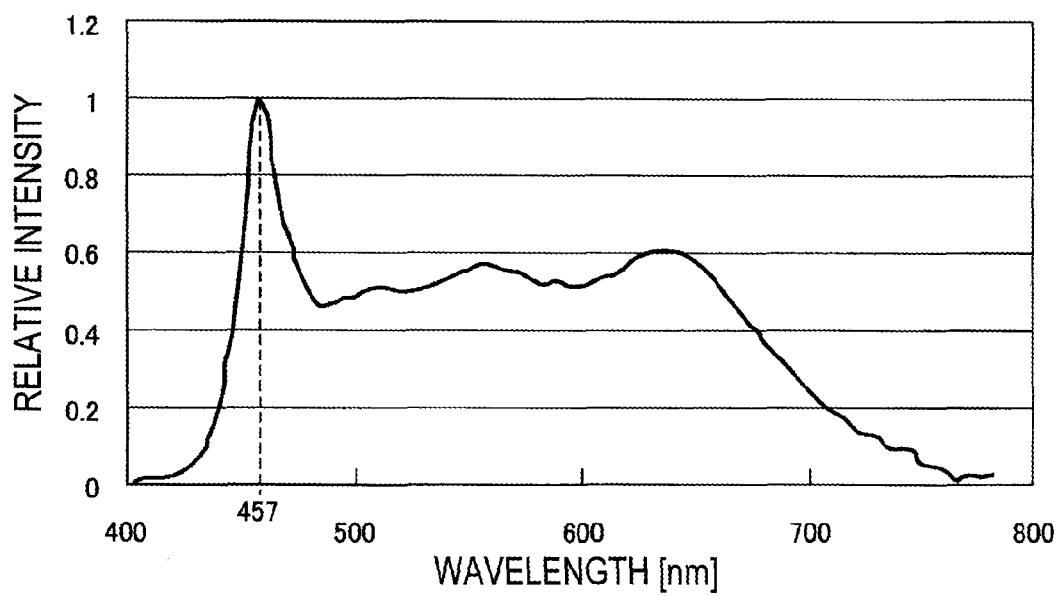

FIG.9

| COLOR RENDER-ING INDEX | COMPARATIVE EXAMPLE 1 | COMPARATIVE EXAMPLE 2 | COMPARATIVE EXAMPLE 3 |
|---|---|---|---|
| Ra | 87.6 | 94.2 | 93.9 |
| R1 | 93.1 | 96.5 | 95.4 |
| R2 | 88.9 | 94.8 | 94.7 |
| R3 | 84.8 | 91.6 | 96.1 |
| R4 | 84.5 | 93.8 | 92.3 |
| R5 | 91.5 | 96.2 | 94.0 |
| R6 | 86.6 | 91.6 | 93.5 |
| R7 | 84.5 | 93.9 | 92.3 |
| R8 | 87.2 | 95.7 | 92.8 |
| R9 | 85.5 | 95.0 | 84.4 |
| R10 | 75.1 | 87.3 | 90.0 |
| R11 | 89.1 | 94.2 | 95.6 |
| R12 | 75.4 | 82.5 | 75.4 |
| R13 | 90.7 | 95.6 | 95.0 |
| R14 | 91.3 | 95.2 | 98.3 |
| R15 | 90.0 | 97.8 | 91.6 |

*FIG.12*

| Ra | 97.3 |
|---|---|
| R1 | 98.9 |
| R2 | 97.8 |
| R3 | 95.2 |
| R4 | 97.1 |
| R5 | 98.8 |
| R6 | 95.8 |
| R7 | 97.1 |
| R8 | 97.4 |
| R9 | 97.4 |
| R10 | 94.2 |
| R11 | 97.1 |
| R12 | 91.8 |
| R13 | 98.5 |
| R14 | 97.0 |
| R15 | 99.2 |

FIG.15

| Ra | 97.6 |
|---|---|
| R1 | 99.4 |
| R2 | 98.2 |
| R3 | 95.8 |
| R4 | 97.3 |
| R5 | 99.3 |
| R6 | 96.7 |
| R7 | 97.2 |
| R8 | 97.0 |
| R9 | 96.2 |
| R10 | 95.3 |
| R11 | 97.5 |
| R12 | 95.9 |
| R13 | 98.9 |
| R14 | 97.3 |
| R15 | 98.6 |

| | CHROMA-TICITY 1 | CHROMA-TICITY 2 | CHROMA-TICITY 3 |
|---|---|---|---|
| COLOR TEMPERATURE | 4762 | 5556 | 5263 |
| CHROMATICITY X | 0.3511 | 0.3313 | 0.3408 |
| CHROMATICITY Y | 0.3582 | 0.3459 | 0.3517 |
| Ra | 87.4 | 92.8 | 96.9 |
| R9 | 84.4 | 84.0 | 94.7 |
| R10 | 77.0 | 87.4 | 94.7 |
| R11 | 86.8 | 95.7 | 94.5 |
| R12 | 67.5 | 74.0 | 94.1 |

|  | CHROMA-TICITY 1 | CHROMA-TICITY 2 | CHROMA-TICITY 3 |
|---|---|---|---|
| COLOR TEMPERATURE | 5263 | 5263 | 5263 |
| CHROMATICITY X | 0.3408 | 0.3408 | 0.3408 |
| CHROMATICITY Y | 0.3517 | 0.3517 | 0.3517 |
| Ra | 86.3 | 92.9 | 96.4 |
| R9 | 86.6 | 80.3 | 96.2 |
| R10 | 73.7 | 88.0 | 93.2 |
| R11 | 85.7 | 95.3 | 94.0 |
| R12 | 67.5 | 74.8 | 94.4 |

LIGHT EMITTING DEVICE

CROSS-REFERENCE TO RELATED APPLICATION

This application claims priority from Japanese Patent Application No. 2015-100664 filed on May 18, 2015, the entire subject matter of which is incorporated herein by reference.

TECHNICAL FIELD

This disclosure relates to a light emitting device configured to excite a fluorescent substance and to output light.

BACKGROUND

A light emitting device using a light emitting element such as a light emitting diode (LED) and a fluorescent substance to be excited by the light emitting element has been practically used. In an LED illumination mechanism of about 2500K to 7500K, a intended continuous spectrum is realized by combining emission spectra of lights emitted from the light emitting element and the fluorescent substance. For example, by setting a general color rendering index Ra (an average of R1 to F8) and a special color rendering index Ri (i=9 to 15) to be high indexes (for example, 90 or higher), a continuous spectrum of the black body radiation at a corresponding color temperature or the sunlight defined by Commission Internationale de l'éclairage (CIE) can be approximately expressed by the LED and the emission light of the fluorescent substance.

An background art provides a method of exciting green, yellow and red fluorescent substances by two blue LEDs having different wavelengths and obtaining white light having a high color rendering property (for example, refer to JP-A-2008-34186A). Another background art provides a method of exciting yellow and red fluorescent substances by two blue LEDs having different wavelengths and adding a green LED or a method of using two blue LEDs, a green LED and a red LED (for example, refer to JP-A-2011-192738A).

SUMMARY

However, any of the green, yellow and red fluorescent substances used in the method has an absorption spectrum in a band of blue to green, so that the emission light from the green fluorescent substance is absorbed by another fluorescent substance. The consumption by the absorption is accompanied by the absorption spectrum of each fluorescent substance, and the emission light of the green fluorescent substance is likely to be reduced at a short wavelength-side. The reduction can be redeemed by a blue-green LED. However, the blue-green LED is involved in the excitations of the respective fluorescent substances, so that it is very difficult to control a wavelength distribution of the emission spectrum.

Also, since the emission light from the yellow fluorescent substance, which is complementarily used, is not almost consumed by the other fluorescent substances, it may deteriorate the color rendering property. In the meantime, according to a method of configuring all colors by the LEDs, it is difficult to balance the wavelength of the emission light, and it is very difficult to control unevenness of the wavelength distribution of the emission spectrum to be small.

As described above, in the light emitting device using the light emitting element such as the LED and the fluorescent substance, it is difficult to make both the general color rendering index and the special color rendering index Ri (i=9 to 15) become high. This disclosure provides a light emitting device capable of exciting a fluorescent substance by a light emitting element and outputting light having an emission spectrum of which all color rendering indexes are high.

A light emitting device includes: a first blue light emitting element and a second blue light emitting element, peak wavelengths of which are different from each other, wherein peak values of emission spectrums of the peak wavelengths are within a wavelength range of 430 nm or longer and 480 nm or shorter, and a fluorescent substance layer comprising: a green fluorescent substance, which is excited by emission lights from the first blue light emitting element and the second blue light emitting element to emit green lights having emission spectrums having a first wavelength indicating a first intensity and a second wavelength indicating a second intensity smaller than the first intensity, respectively; and a red fluorescent substance, which has an absorption spectrum in which absorption is less in the second wavelength than in the first wavelength and which is excited by the emission lights from the first blue light emitting element and the second blue light emitting element to emit red lights.

According to this disclosure, it is possible to provide the light emitting device capable of exciting the fluorescent substance by the light emitting element and outputting the light having an emission spectrum of which all color rendering indexes are high.

BRIEF DESCRIPTION OF THE DRAWINGS

The foregoing and additional features and characteristics of this disclosure will become more apparent from the following detailed descriptions considered with the reference to the accompanying drawings, wherein:

FIG. 5 illustrates an example of an emission spectrum of output light from the light emitting device according to the first illustrative embodiment of this disclosure;

FIG. 6 illustrates an example of the emission spectrum of the blue light emitting element;

FIG. 7 illustrates an example of the emission spectrum of the blue light emitting element;

FIG. 8 illustrates an example of the emission spectrum of the blue light emitting element;

FIG. 9 is a table illustrating color rendering indexes of output light from the light emitting device in which the blue light emitting element is one;

FIG. 12 is a table illustrating color rendering indexes of the output light from the light emitting device according to the first illustrative embodiment of this disclosure;

FIG. 15 is a table illustrating the color rendering indexes of the output light from the light emitting device according to the first illustrative embodiment of this disclosure;

DETAILED DESCRIPTION

Figure 1:
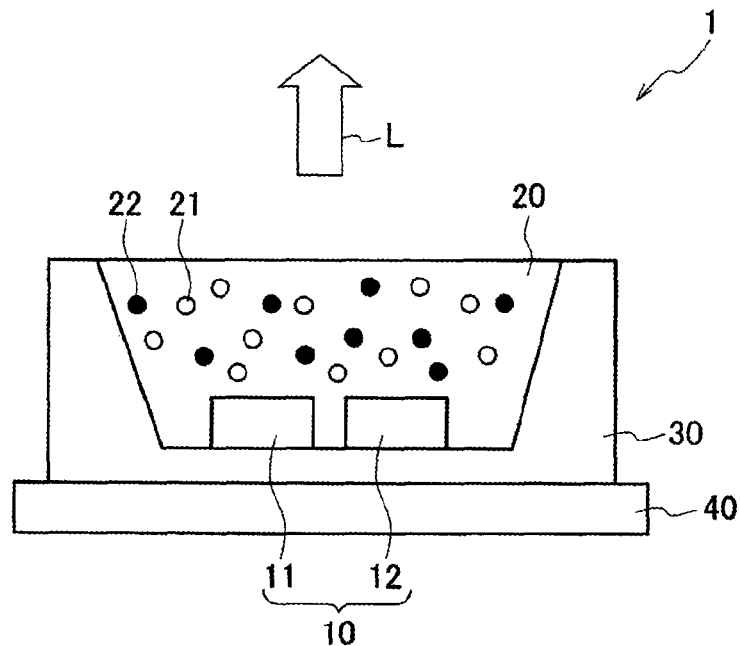
FIG. 1 is a pictorial view illustrating a configuration of a light emitting device according to a first illustrative embodiment of this disclosure.

Hereinafter, illustrative embodiments of this disclosure will be described with reference to the drawings. In below descriptions, the same or similar parts are denoted with the same or similar reference numerals. The below illustrative embodiments are to exemplify an apparatus and a method for concretizing the technical spirit of this disclosure, and the technical spirit of this disclosure is not limited to the illustrative embodiments as regards the shapes, structures, arrangement and the like of the constitutional components. The illustrative embodiments of this disclosure can be variously changed within the range of the claims.

First Illustrative Embodiment

As shown in FIG. 1, a light emitting device 1 according to a first illustrative embodiment of this disclosure includes a first blue light emitting element 11, a second blue light emitting element 12, and a fluorescent substance layer 20 including a green fluorescent substance 21 and a red fluorescent substance 22. The first blue light emitting element 11 and second blue light emitting element 12 shown in FIG. 1 are blue LEDs configured to emit blue light.

The green fluorescent substance 21 is excited by output lights of the first blue light emitting element 11 and second blue light emitting element 12 and emits green light having an emission spectrum having a first wavelength indicating a first intensity and a second wavelength indicating a second intensity smaller than the first intensity. The red fluorescent substance 22 is excited by the output lights of the first blue light emitting element 11 and second blue light emitting element 12 and emits red light. The red fluorescent substance 22 has an absorption spectrum of which absorption is less in the second wavelength than in the first wavelength as regards the green light emitted from the green fluorescent substance 21. The emission spectrum of the output light of the green fluorescent substance 21 and the absorption spectrum of the red fluorescent substance 22 will be described in detail later.

In the light emitting device 1, the first blue light emitting element 11 and the second blue light emitting element 12 are arranged on a bottom of a recess portion of a package 30 having the recess portion. The recess portion of the package 30 is filled with the fluorescent substance layer 20. As the fluorescent substance layer 20, a silicon resin containing the green fluorescent substance 21 and the red fluorescent substance 22 may be adopted, for example. Also, the package 30 is mounted on a substrate 40. An electrical wiring (not shown) is arranged on the substrate 40, and the first blue light emitting element 11 and the second blue light emitting element 12 are respectively connected to the electrical wiring. When a voltage is applied through the electrical wiring, the driving current flows, so that the first blue light emitting element 11 and the second blue light emitting element 12 emit the lights.

The first blue light emitting element 11 and the second blue light emitting element 12 have a peak wavelength, respectively, which is a wavelength of a peak value of the emission spectrum within a wavelength range of 430 nm or longer and 480 nm or shorter. In the light emitting device 1, in order to redeem a demerit of the blue LED having a narrow half-value width, two blue LEDs having different wavelengths are used as the first blue light emitting element 11 and the second blue light emitting element 12. Thereby, it is possible to increase a color rendering index R12 of which an index tends to be low. According to the light emitting device 1, it is possible to implement the same brightness as a general LED illumination device through the excitation by the blue LEDs.

Figure 2:
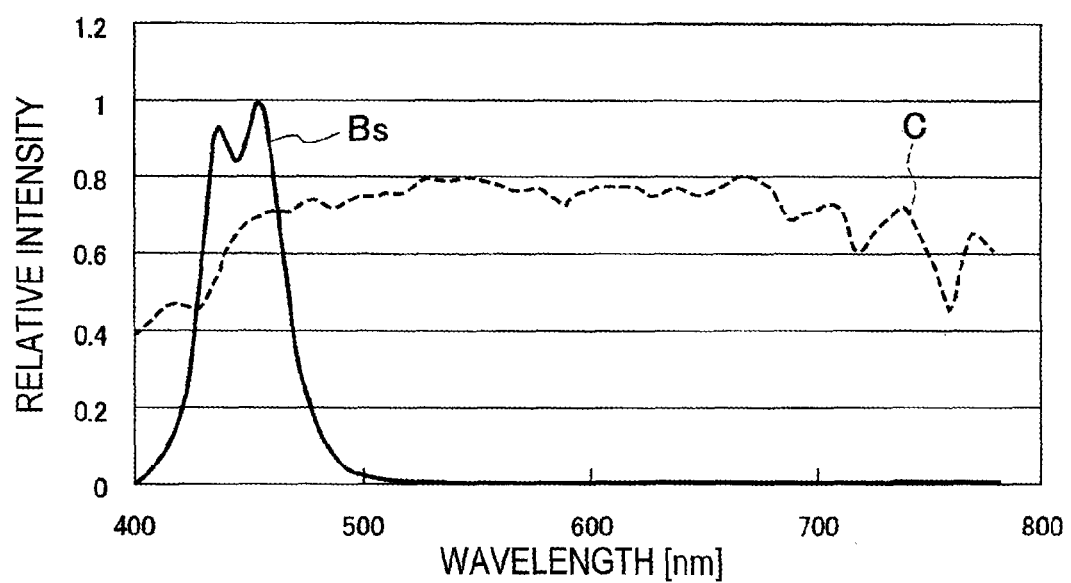
FIG. 2 illustrates an example of an emission spectrum of a blue light emitting element according to the first illustrative embodiment of this disclosure.

For example, as shown in FIG. 2, an emission spectrum Bs having a high intensity over the entire wavelength area of the blue light is obtained by the first blue light emitting element 11 and the second blue light emitting element 12. In FIG. 2, a dotted line C indicates an emission spectrum of reference light of 5000K defined by Commission internationale de l' éclairage (CIE) (this is also the same, in the below). Meanwhile, in the below, the first blue light emitting element 11 and the second blue light emitting element 12 are collectively referred to as 'blue light emitting element 10'.

Figure 3:
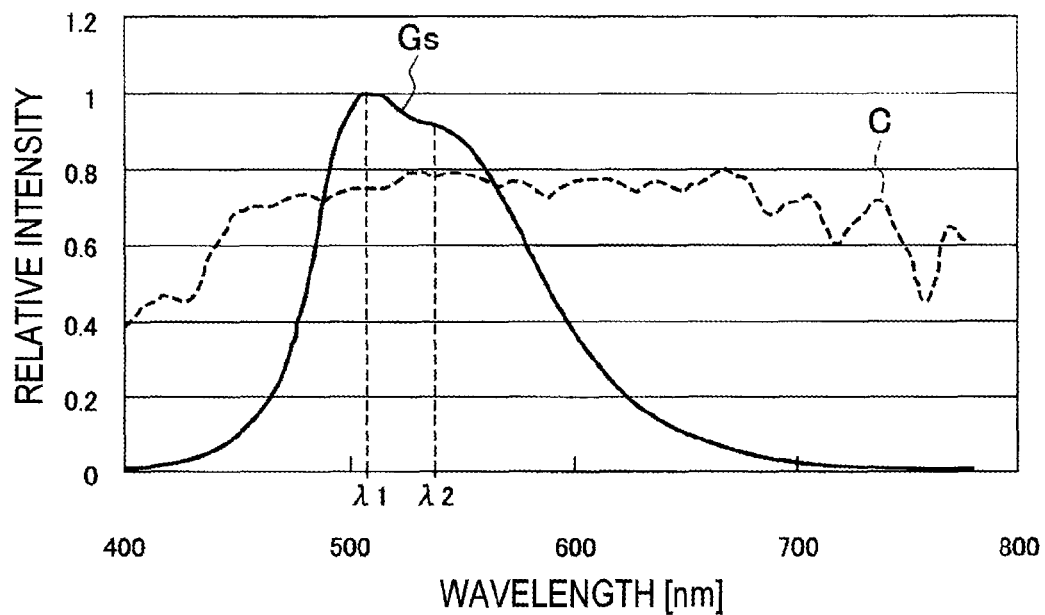
FIG. 3 illustrates an example of an emission spectrum of light emitted from a green fluorescent substance of the light emitting device according to the first illustrative embodiment of this disclosure.

The green fluorescent substance 21 is excited by the blue light emitted from the blue light emitting element 10 and emits green light. An emission spectrum of the green light emitted from the green fluorescent substance 21 has a first wavelength and a second wavelength of which intensities are different. For example, the green fluorescent substance 21 emitting the green light having an emission spectrum Gs as shown in FIG. 3 is adopted for the light emitting device 1. In the example of the emission spectrum shown in FIG. 3, a first wavelength $\lambda 1$ indicating a first intensity is positioned at a shorter wavelength-side than a second wavelength $\lambda 2$ indicating a second intensity smaller than the first intensity. More specifically, the emission spectrum of the green light emitted from the green fluorescent substance 21 has a first peak value at the first wavelength $\lambda 1$ and a second peak value smaller than the first peak value at the second wavelength $\lambda 2$ longer than the first wavelength $\lambda 1$.

Figure 4:
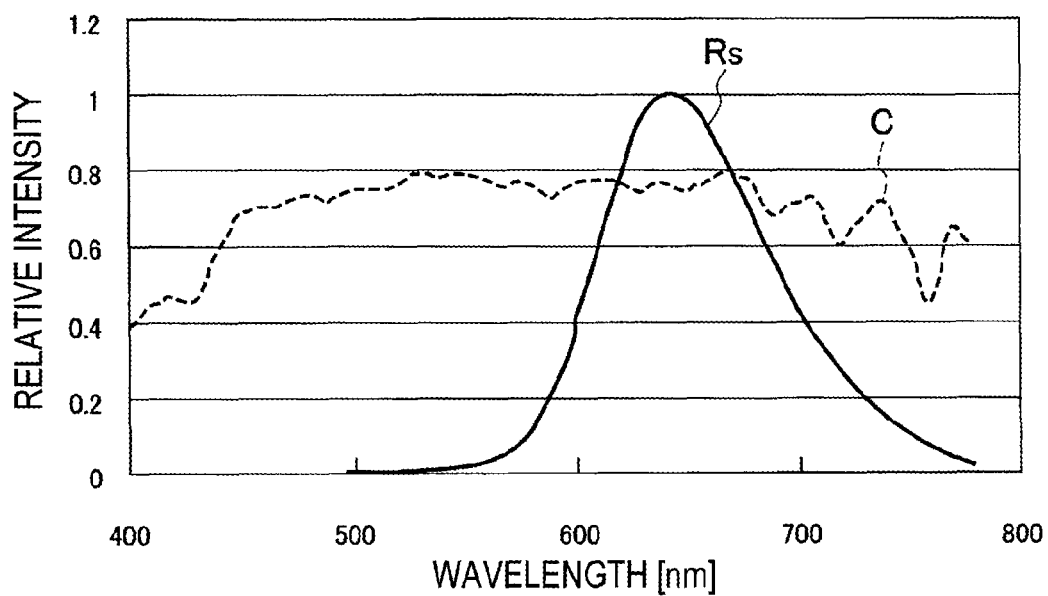
FIG. 4 illustrates an example of an emission spectrum of light emitted from a red fluorescent substance of the light emitting device according to the first illustrative embodiment of this disclosure.

The red fluorescent substance 22 is excited by the blue light emitted from the blue light emitting element 10 and emits red light. An example of an emission spectrum Rs of the red light emitted from the red fluorescent substance 22 is shown in FIG. 4.

The light emitting device 1 is configured to output an output light L in which the blue light emitted from the blue light emitting element 10, the green light emitted from the green fluorescent substance 21 and the red light emitted from the red fluorescent substance 22 are color-mixed. An emission spectrum Ls of the output light L, in which the blue light, the green light and the red light of which emission spectra are respectively shown in FIGS. 2 to 4 are color-mixed, is shown in FIG. 5. The emission spectrum Ls is an emission spectrum in which an area S1 by the blue light emitted from the blue light emitting element 10, an area S2 by the green light emitted from the green fluorescent substance 21 and an area S3 by the red light emitted from the red fluorescent substance 22 are continuous.

However, a wavelength distribution of the intensity is different between the emission spectrum Gs shown in FIG. 3 and the area S2 of the emission spectrum Ls shown in FIG. 5. Specifically, while the intensity at the first wavelength $\lambda 1$ is greater than the intensity at the second wavelength $\lambda 2$ in FIG. 3, the intensity at the first wavelength $\lambda 1$ is smaller than the intensity at the second wavelength $\lambda 2$ in FIG. 5. This is because the red fluorescent substance 22 has an absorption spectrum of which absorption is less in the second wavelength $\lambda 2$ than in the first wavelength $\lambda 1$ as regards the green light. That is, since the green light is more consumed at the first wavelength $\lambda 1$ than at the second wavelength $\lambda 2$ by the red fluorescent substance 22, the intensities in the green wavelength area are reversed in the emission spectrum Ls of the output light L. As a result, according to the light emitting device 1, the output light L having the emission spectrum Ls of which wavelength is balanced, i.e., wavelength distribution is less uneven, as shown in FIG. 5, is obtained. In the output light L of the emission spectrum Ls, the color rendering index Ri (i=1 to 15) are 90 or greater over the entire area and the general color rendering index Ra of 95 or greater is obtained.

As described above, the light emitting device 1 can output the output light L having the emission spectrum of which both a general color rendering index Ra and a special color rendering index Ri (i=9 to 15) are high.

As the green fluorescent substance 21 emitting the green light having the emission spectrum Gs as shown in FIG. 3, an oxide-based fluorescent substance and the like are used. Specifically, a scandate or scandium-based oxide is used in which an activator is $Ce^{3+}$ and which transits to two ground levels separated from a crystal field and has two peak values on the emission spectrum. For example, $CaSc_2O_4:Ce^{3+}$, $Ca_3Sc_2Si_3O_{12}:Ce^{3+}$, $Ca_3(Sc, Mg)_2Si_3O_{12}:Ce^{3+}$ and the like activated by $Ce^{3+}$ can be adopted as the green fluorescent substance 21. According to the green fluorescent substance 21, the green light having an emission spectrum in which a first wavelength $\lambda 1$ indicating a first peak value is positioned at a shorter wavelength-side than a second wavelength $\lambda 2$ indicating a second peak value smaller than the first peak value is output.

As the red fluorescent substance 22, a nitride-based fluorescent substance having a wide band, and the like are used. As the red fluorescent substance 22 having an absorption spectrum in which absorption at the first wavelength $\lambda 1$ is greater than absorption at the second wavelength $\lambda 2$, an aluminum nitride-based fluorescent substance such as $CaAlSiN_3:Eu^{2+}$, $(Sr, Ca)AlSiN_3:Eu^{2+}$ and the like activated by $Eu^{2+}$ can be adopted.

In the light emitting device 1, the first blue light emitting element 11 and the second blue light emitting element 12 having different peak wavelengths indicating peak values are used, so that the intensity of the output light L is maintained high over the entire area of the wavelength area of the blue light. In contrast, a comparative example where a blue light emitting element having one peak wavelength was singularly used is described below. Here, as the comparative examples 1 to 3, the blue LEDs having peak wavelengths 437 nm, 447 nm and 457 nm were used, instead of the blue light emitting element 10. In the meantime, the above-described fluorescent substances were used as the green fluorescent substance 21 and the red fluorescent substance 22.

The emission spectra of the output lights L of the comparative examples 1 to 3 are respectively shown in FIGS. 6 to 8. Also, the color rendering indexes of the comparative examples 1 to 3 are shown in FIG. 9. In FIG. 9, the color rendering index of 90 or smaller is hatched. As shown in FIG. 9, any of the comparative examples 1 to 3 has the color rendering index of 90 or smaller. In particular, all the comparative examples 1 to 3 have the color rendering index R12 of 90 or smaller.

Figure 10:
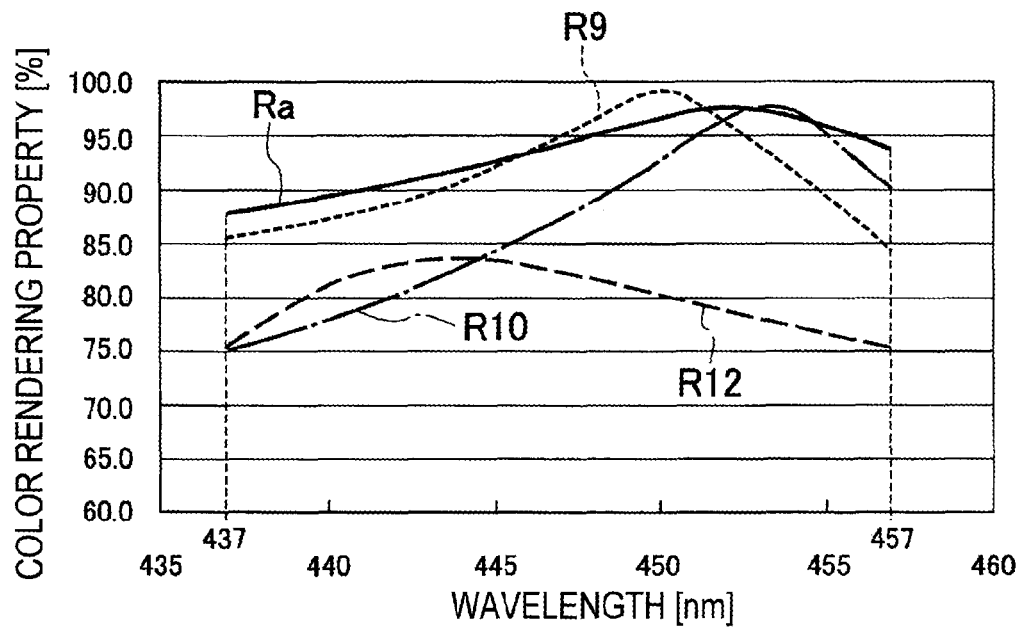
FIG. 10 is a graph illustrating color rendering properties of output light from the light emitting device in which the blue light emitting element is one.

FIG. 10 illustrates the color rendering properties obtained when the blue LED having a peak wavelength of 437 nm to 457 nm is singularly used to excite the green fluorescent substance 21 and the red fluorescent substance 22. In FIG. 10, the color rendering property of the shortest wavelength is the color rendering property obtained when the blue LED having a peak wavelength of 437 nm is used, and the color rendering property of the longest wavelength is the color rendering property obtained when the blue LED having a peak wavelength of 457 nm. As shown in FIG. 10, the color rendering index R12 is 85 or smaller over the entire area of the wavelength 437 nm to 457 nm.

Figure 11:
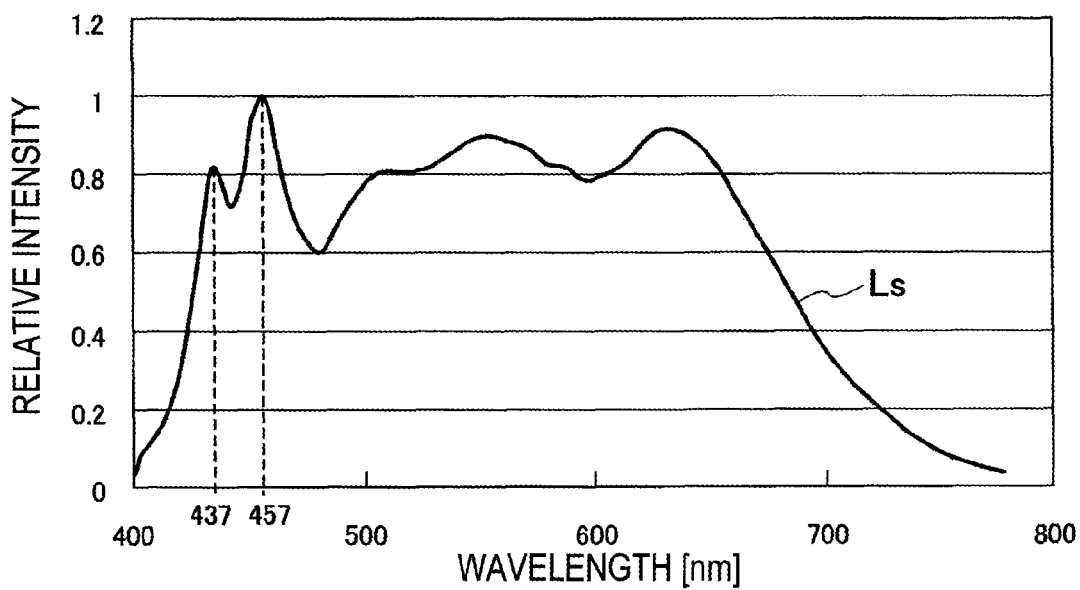
FIG. 11 illustrates an example of the emission spectrum of the output light from the light emitting device according to the first illustrative embodiment of this disclosure.

In contrast, the color rendering index of the output light L having an emission spectrum Ls shown in FIG. 11, which is obtained by using the first blue light emitting element 11 of which peak wavelength is 437 nm and the second blue light emitting element 12 of which peak wavelength is 457 nm, is shown in FIG. 12. As shown in FIG. 12, the color rendering indexes including the color rendering index R12 are 90 or greater over the entire area.

As described above, when the first blue light emitting element 11 and the second blue light emitting element 12 having different peak wavelengths are used, it is possible to improve the color rendering index R12 of which an index tends to be low. Also, it is possible to increase the general color rendering index Ra to a value of 95 or greater.

In the meantime, when the peak wavelengths and outputs of the first blue light emitting element 11 and second blue light emitting element 12 are appropriately selected, all the color rendering indexes Ri (i=1 to 15) can be made to be 95 or greater. A specific example is described.

Figure 13:
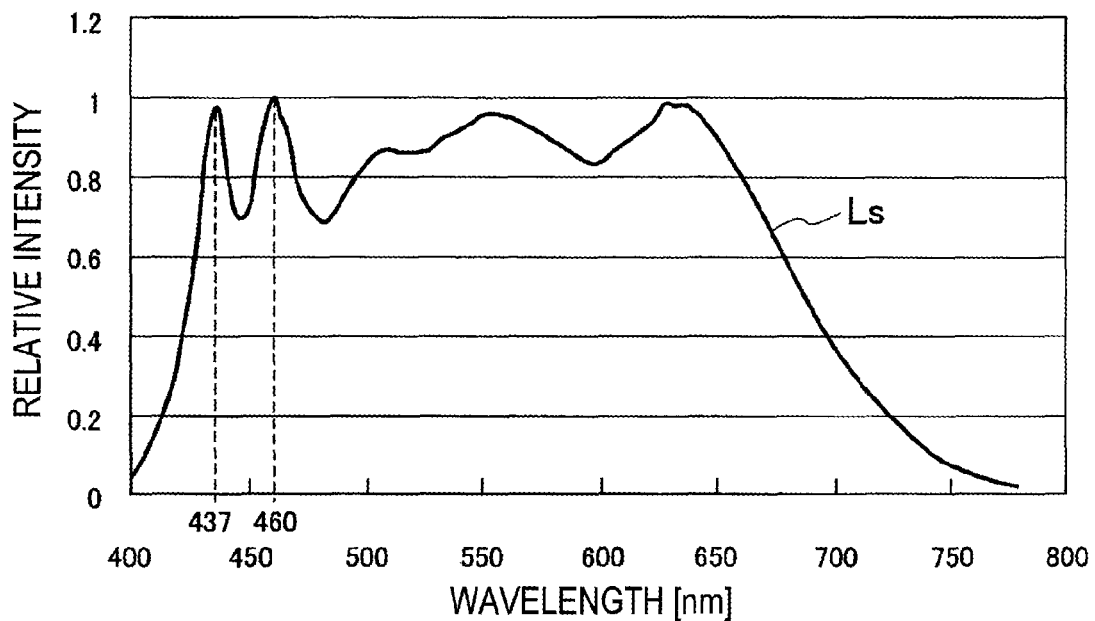
FIG. 13 illustrates another example of the emission spectrum of the output light from the light emitting device according to the first illustrative embodiment of this disclosure.
Figure 14:
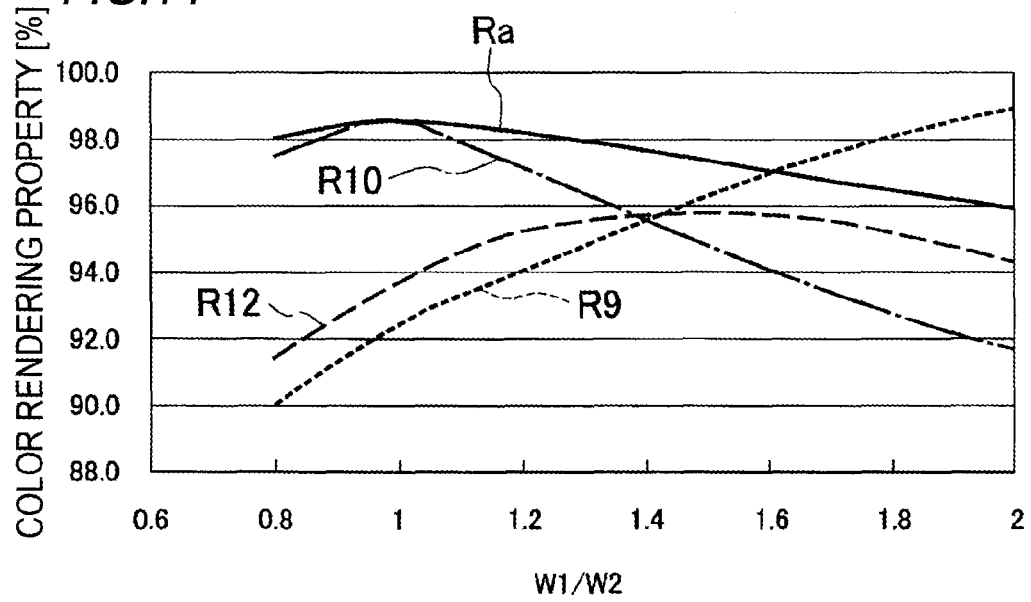
FIG. 14 is a graph illustrating the color rendering properties of the output light from the light emitting device according to the first illustrative embodiment of this disclosure.

FIG. 13 illustrates the emission spectrum Ls of the output light L obtained when the first blue light emitting element 11 having a peak wavelength of 437 nm and the second blue light emitting element 12 having a peak wavelength of 460 nm are used. At this time, an output of the first blue light emitting element 11 is denoted with W1, and an output of the second blue light emitting element 12 is denoted with W2. A relation between an output ratio W1/W2 of the output W1 to the output W2 and the color rendering property of the output light L is shown in FIG. 14. As shown in FIG. 14, the general color rendering index Ra increases in the vicinity of the output ratio W1/W2 (=1). Also, the color rendering index R12 increases in the vicinity of the output ratio W1/W2 (=1.4). In the meantime, as the output ratio W1/W2 approaches 2, the color rendering index R9 increases.

The color rendering index of the output light L at the output ratio W1/W2 (=1.4) of FIG. 14 is shown in FIG. 15. As shown in FIG. 15, all the color rendering indexes Ri (i=1 to 15) are 95 or greater. At this time, the general color rendering index Ra is 97 or greater. In the meantime, according to the inventor's examination, when the output ratio W1/W2 was 0.8, the color rendering index Ri (i=1 to 15) was 90 or greater and the general color rendering index Ra was 98 or greater.

The inventors found out that when following conditions are satisfied, the output light L having the color rendering index of 90 or greater over the entire area is output from the light emitting device 1. That is, when the peak wavelength and output of the first blue light emitting element 11 are denoted with p1 and W1 and the peak wavelength and output of the second blue light emitting element 12 are denoted with p2 and W2, the first blue light emitting element 11 and the second blue light emitting element 12 are selected so that following equations (1) to (3) are satisfied.

$$430 \text{ nm} \leq p1 < p2 \leq 480 \text{ nm} \quad (1)$$

$$p1 - p2 \geq 16 \text{ nm} \quad (2)$$

$$0.5 \leq (W1/W2) \leq 2 \quad (3)$$

For example, in case of W1=W2, all the color rendering indexes Ri (i=1 to 15) can be made to be 90 or greater and the general color rendering index Ra can be made to be 95 when p1 is 430 nm and p2 is 449 nm or when p1 is 440 nm and p2 is 480 nm.

The inventors found out that it is possible to reduce a difference between the peak wavelength p1 and the peak wavelength p2 by changing the output ratio W1/W2. For this reason, as shown in the equation (2), it is possible to reduce the difference between the peak wavelength p1 and the peak wavelength p2 to 16 nm. It is possible to change the output ratio W1/W2 by adjusting the driving currents of the first blue light emitting element 11 and second blue light emitting element 12, respectively. That is, it is possible to adjust the emission spectrum and color rendering index of the output light L in conformity to the specification and uses by adjusting a ratio of the driving currents of the first blue light emitting element 11 and the second blue light emitting element 12.

For example, when W1:W2: is set to 1:1, the output light L of which the general color rendering index Ra is high is obtained. In the meantime, in order to make all the color rendering indexes Ri (i=1 to 15) high, the ratio of W1:W2 is set to 1:1.4 and the like. Alternatively, when intending to make the red strong, the ratio of W1:W2 is set to 1:2.

Also, even when the difference between the peak wavelength p1 and the peak wavelength p2 is small, it is possible to increase the general color rendering index Ra by increasing the output ratio W1/W2. For this reason, the options of the first blue light emitting element 11 and second blue light emitting element 12 are expanded.

Subsequently, a combination of the green fluorescent substance 21 and the red fluorescent substance 22 will be described. As described above, in the light emitting device 1, the green fluorescent substance 21 having an emission spectrum in which the intensity at the first wavelength $\lambda 1$ is greater than the intensity at the second wavelength $\lambda 2$ and the red fluorescent substance 22 having an absorption spectrum in which the absorption is less in the second wavelength $\lambda 2$ than in the first wavelength $\lambda 1$ as regards the green light are combined. Thereby, the output light L having an emission spectrum in which the wavelength is balanced and the wavelength distribution is less uneven is output from the light emitting device 1.

Figure 16:
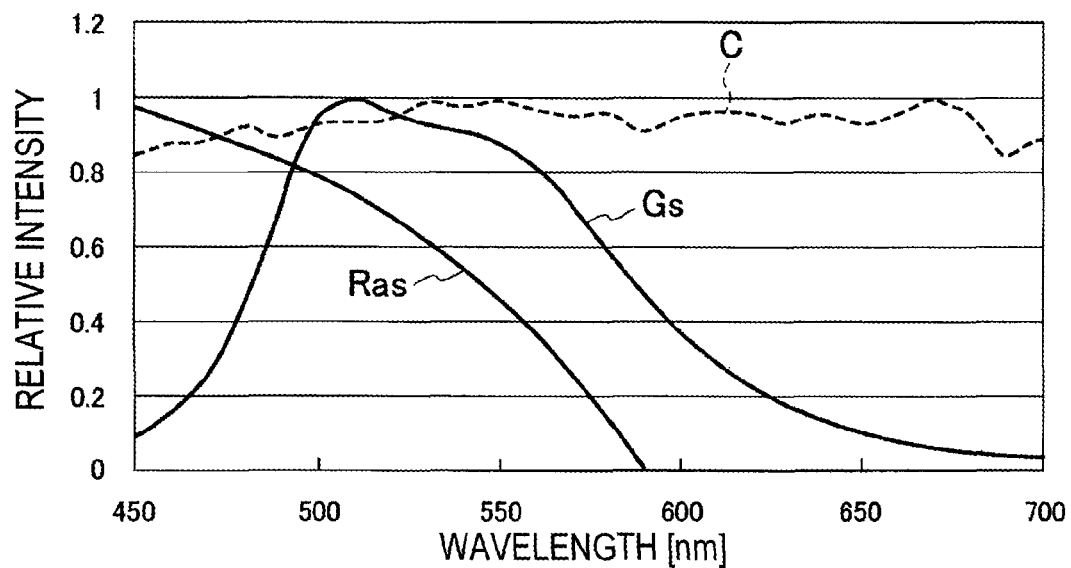
FIG. 16 illustrates an example of the emission spectrum of the output light of the green fluorescent substance and an absorption spectrum of a red fluorescent substance in the light emitting device according to the first illustrative embodiment of this disclosure.

For example, as shown in FIG. 16, the green fluorescent substance 21 having an emission spectrum Gs, which is an asymmetric broad spectrum of which a main peak is positioned at a short wavelength-side, and the red fluorescent substance 22 having an absorption spectrum Ras of which a wavelength dependency is the same tendency as the emission spectrum Gs are combined. The wavelength dependencies of the emission spectrum Gs and the absorption spectrum Ras are preferably similar to each other. In the meantime, the emission spectrum Gs shown in FIG. 16 is an example where the green fluorescent substance 21 is $Ca_3(Sc, Mg)_2Si_3O_{12}$:$Ce^{3+}$. The absorption spectrum Ras is an example where red fluorescent substance 22 is $CaAlSiN_3$:$Eu^{2+}$.

Figure 17:
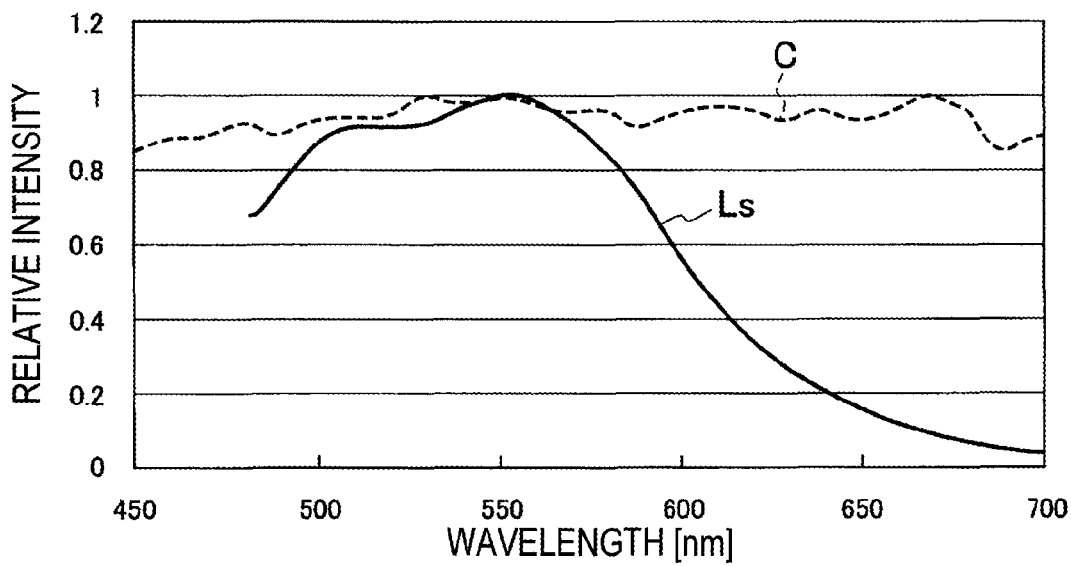
FIG. 17 illustrates an example of the emission spectrum of the output light of the green fluorescent substance after absorbed by the red fluorescent substance, in the light emitting device according to the first illustrative embodiment of this disclosure.
Figure 18:
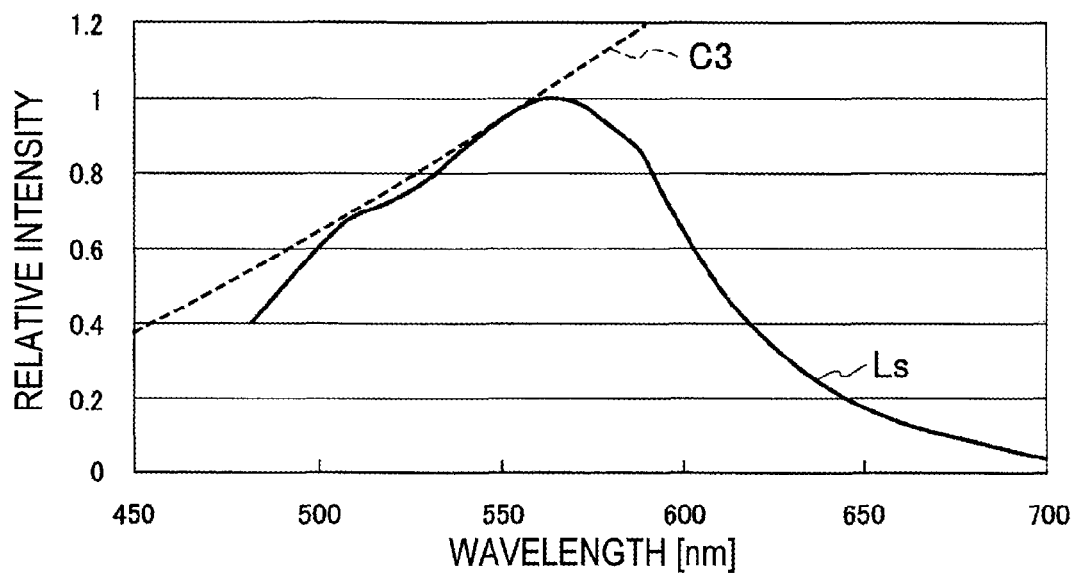
FIG. 18 illustrates another example of the emission spectrum of the output light of the green fluorescent substance after absorbed by the red fluorescent substance, in the light emitting device according to the first illustrative embodiment of this disclosure.

The green light emitted from the green fluorescent substance 21 is consumed by the red fluorescent substance 22, so that the emission spectrum Ls of the output light L can be approximated to the emission spectrum (dotted line C) of the reference light of 5000K in the area of the green light, as shown in FIG. 17. Also, when a mixing ratio of the green fluorescent substance 21 and red fluorescent substance 22 included in the fluorescent substance layer 20 is adjusted, for example, the emission spectrum Ls of the output light L can be approximated to the emission spectrum (dotted line C3) of the reference light of 3000K in the area of the green light, as shown in FIG. 18.

As described above, according to the light emitting device 1 of the first illustrative embodiment of this disclosure, the emission lights of the two blue light emitting elements 10 having different peak wavelengths are used as the excitation lights for the green fluorescent substance 21 and the red fluorescent substance 22 of which a gradient of the absorption spectrum as regards the green light approximates to a gradient of the emission spectrum of the green fluorescent substance 21. Thereby, it is possible to change the shape of the emission spectrum of the green light emitted from the green fluorescent substance 21 to the desired shape of the emission spectrum. As a result, the output light L having an emission spectrum in which the wavelength is balanced and the wavelength distribution is less uneven is output from the light emitting device 1.

Also, according to the light emitting device 1, the output light L having an emission spectrum of which all the color rendering index are high is output. That is, when the peak wavelengths and outputs of the first blue light emitting element 11 and second blue light emitting element 12 are appropriately set on the basis of the equations (1) to (3), it is possible to realize the desired high color rendering indexes.

Also, when the types of the green fluorescent substance 21 and red fluorescent substance 22 and the mixing ratio of the green fluorescent substance 21 and red fluorescent substance 22 in the fluorescent substance layer 20 are appropriately selected, the output light L approximate to the reference light of 5000K, 3000K and the like is obtained.

As another method of realizing the high color rendering properties, which are obtained in the light emitting device 1, in the LED, there is a method of exciting the red fluorescent substance, the green fluorescent substance and the blue fluorescent substance by a UV-LED configured to output near-ultraviolet (UV) light. However, according to this method, since it is also necessary to make the blue light by the excitation, the conversion loss is great. In addition to the method of exciting all of the red fluorescent substance, the green fluorescent substance and the blue fluorescent substance by the UV-LEDs, there are some conversion methods of exciting the blue fluorescent substance by the UL-LED and exciting the red fluorescent substance and the green fluorescent substance by the emission light from the blue fluorescent substance. However, the conversion loss is great in any method.

In contrast, the light emitting device 1 using the excitation by the blue light emitting element has the performance twice as high as the method of using the UV-LED, as regards the light output, the brightness, the conversion efficiency and the like. For this reason, the light emitting device 1 can be applied to an illumination utility, as it is. In the meantime, one blue light emitting element can be used inasmuch as all the color rendering indexes of the output light L are 80 or higher.

Even when a fluorescent substance having a wide half-width value, rather than the above-described fluorescent substances, for example, $Lu_3Al_5O_{12}$ is used for the green fluorescent substance 21, the output light L is output from the light emitting device 1. However, even when a single peak has a wide half-width value, it is difficult to conform the single peak to a spectrum line of the reference light only with the excitation spectrum (absorption spectrum) of the red fluorescent substance, and it is not possible to increase all the color rendering indexes to 90 or greater.

In contrast, according to the light emitting device 1, the green fluorescent substance 21 having an emission spectrum which is asymmetric with respect to the main peak, for example, and has a main peak at the short wavelength-side is used, and the two types of fluorescent substances, i.e., the green fluorescent substance 21 and the red fluorescent substance 22 are to be sufficient. For this reason, as compared to a configuration where three or more types of fluorescent substances are used, the conversion loss is less and the output light L is brighter. Also, since it is possible to expand the wavelength selection range of the blue light, the condition range of the excitation light is expanded.

Second Illustrative Embodiment

Figure 19:
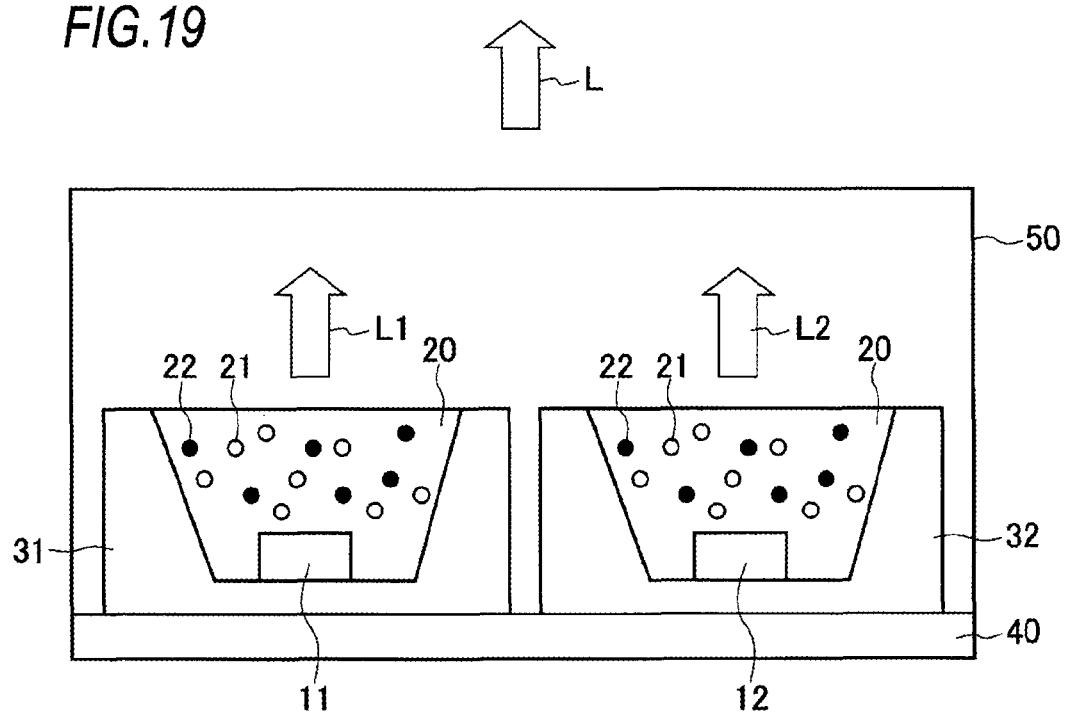
FIG. 19 is a pictorial view illustrating a configuration of a light emitting device according to a second illustrative embodiment of this disclosure.

In the light emitting device 1 shown in FIG. 1, the first blue light emitting element 11 and the second blue light emitting element 12 are arranged on the bottom of the recess portion of the one package 30. However, as shown in FIG. 19, the first blue light emitting element 11 and the second blue light emitting element 12 may be respectively arranged in a first package 31 and a second package 32. In the meantime, respective recess portions of the first package 31 and the second package 32 are filled with the fluorescent substance layer 20 containing the green fluorescent substance 21 and red fluorescent substance 22. Also, the first package 31 and the second package 32 are arranged on the substrate 40 in a lamp fitting 50.

In order to output the output light L of which all the color rendering indexes are high from the light emitting device 1 shown in FIG. 19, two following methods are considered.

A first method is to configure output light L1, which is to be output from the first package 31, and output light L2, which is to be output from the second package 32, with different chromaticities. Then, the output light L1 and the output light L2 are color-mixed in the lamp fitting 50, so that the output light L having a desired chromaticity is output from the lamp fitting 50. At this time, the chromaticity of the output light L1 and the chromaticity of the output light L2 are adjusted so that the output light L has a desired chromaticity.

In order to set the chromaticity of the output light L1 to a predetermined value, the peak wavelength and output of the first blue light emitting element 11, the mixing ratio of the green fluorescent substance 21 and red fluorescent substance 22 contained in the fluorescent substance layer 20 in the first package 31, and the like are set. Also, in order to set the chromaticity of the output light L2 to a predetermined value, the peak wavelength and output of the second blue light emitting element 12, the mixing ratio of the green fluorescent substance 21 and red fluorescent substance 22 contained in the fluorescent substance layer 20 in the second package 32, and the like are set.

Figure 20:
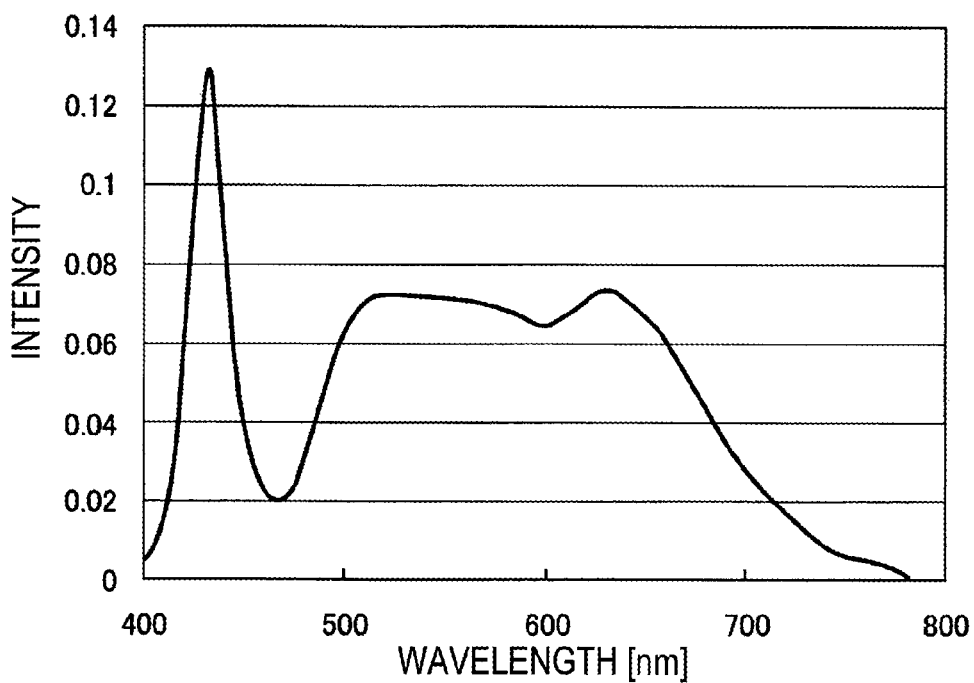
FIG. 20 illustrates an example of the emission spectrum of the output light from a first package of the light emitting device according to the second illustrative embodiment of this disclosure.
Figure 21:
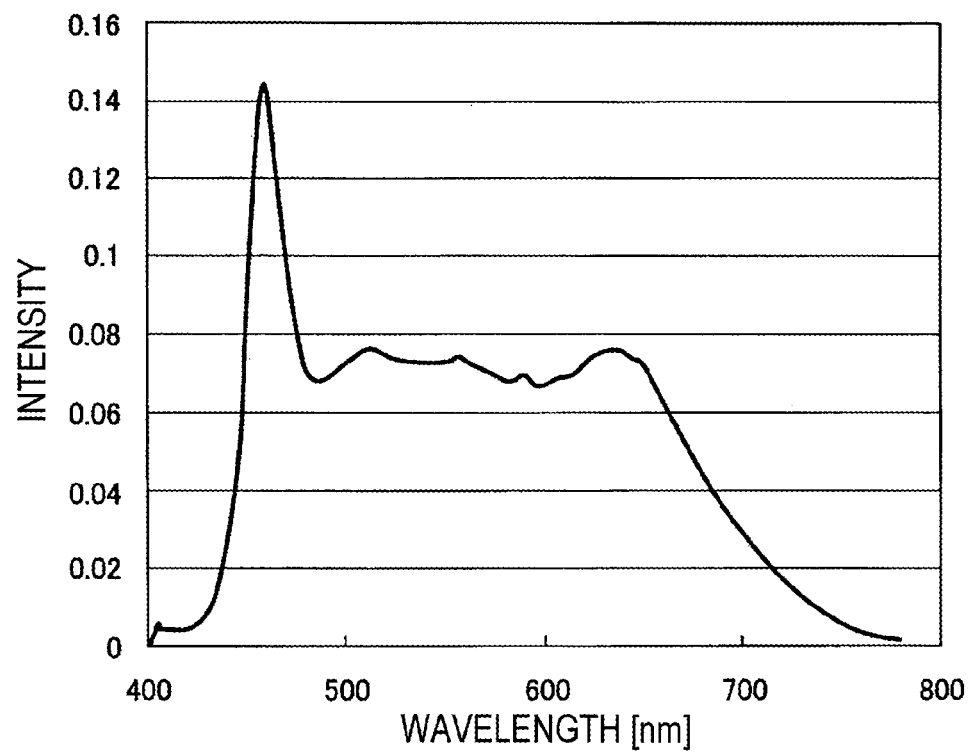
FIG. 21 illustrates an example of the emission spectrum of the output light from a second package of the light emitting device according to the second illustrative embodiment of this disclosure.
Figures 22, 23:
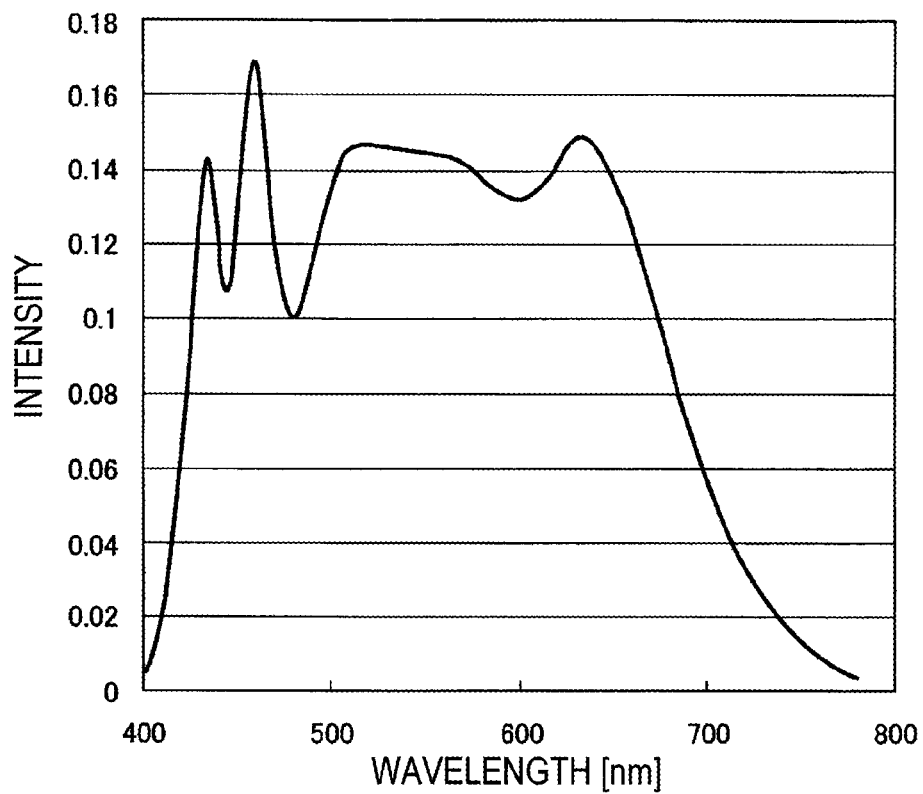
FIG. 22 illustrates an example of the emission spectrum of the output light from the light emitting device according to the second illustrative embodiment of this disclosure.
FIG. 23 is a table illustrating chromaticity of the output light from the light emitting device according to the second illustrative embodiment of this disclosure.

For example, the output light L1 having a chromaticity 1 shown in FIG. 20 and the output light L2 having a chromaticity 2 shown in FIG. 21 are combined to synthesize the output light L having a desired chromaticity 3 shown in FIG. 22. In the meantime, the peak wavelength of the first blue light emitting element 11 is shorter than the peak wavelength of the second blue light emitting element 12. The chromaticity 1 to the chromaticity 3 are exemplified in FIG. 23. As shown in FIG. 23, the high color rendering indexes of 90 or greater are obtained in the output light L.

A second method is to make a chromaticity of the output light L1, which is to be output from the first package 31, and a chromaticity of the output light L2, which is to be output from the second package 32, be the same. Thereby, it is possible to make the output light L, which is obtained by color-mixing the output light L1 and the output light L2 in the lamp fitting 50, have a desired chromaticity. By adjusting the mixing ratio of the green fluorescent substance 21 and red fluorescent substance 22 contained in the fluorescent substance layer 20, it is possible to set the chromaticity of the output light L1 and the chromaticity of the output light L2 to predetermined values.

Figure 24:
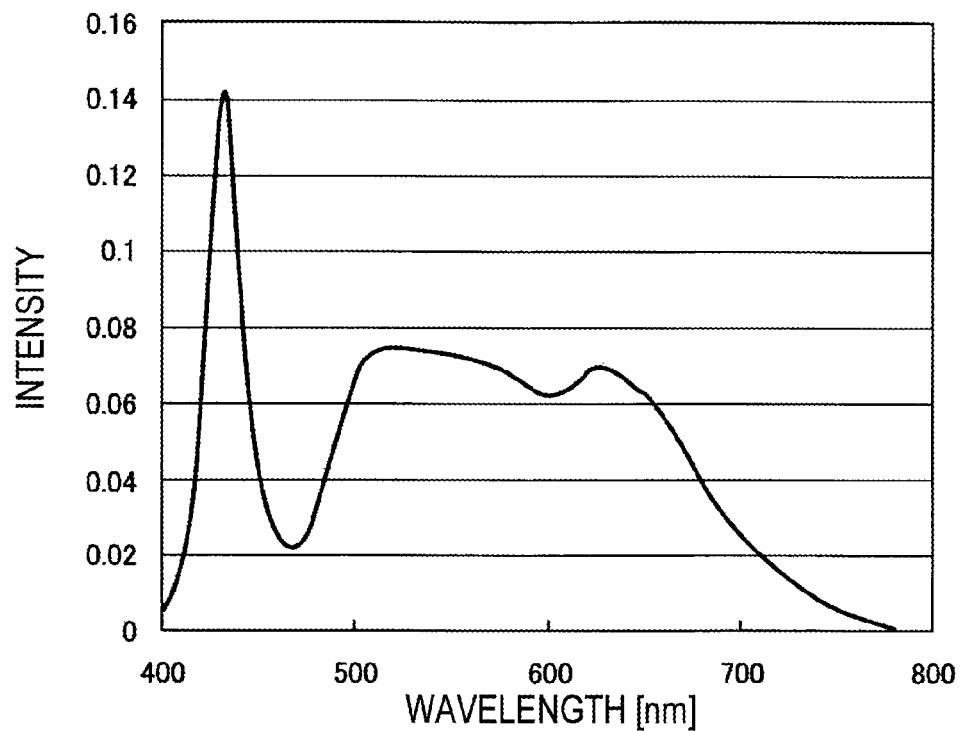
FIG. 24 illustrates another example of the emission spectrum of the output light from the first package of the light emitting device according to the second illustrative embodiment of this disclosure.
Figure 25:
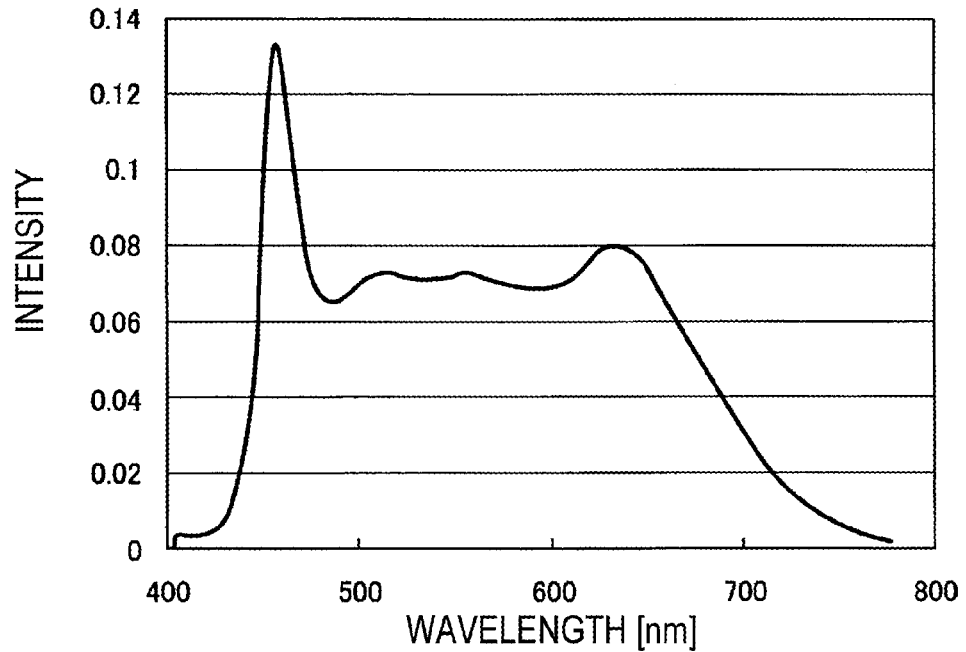
FIG. 25 illustrates another example of the emission spectrum of the output light from the second package of the light emitting device according to the second illustrative embodiment of this disclosure.
Figures 26, 27:
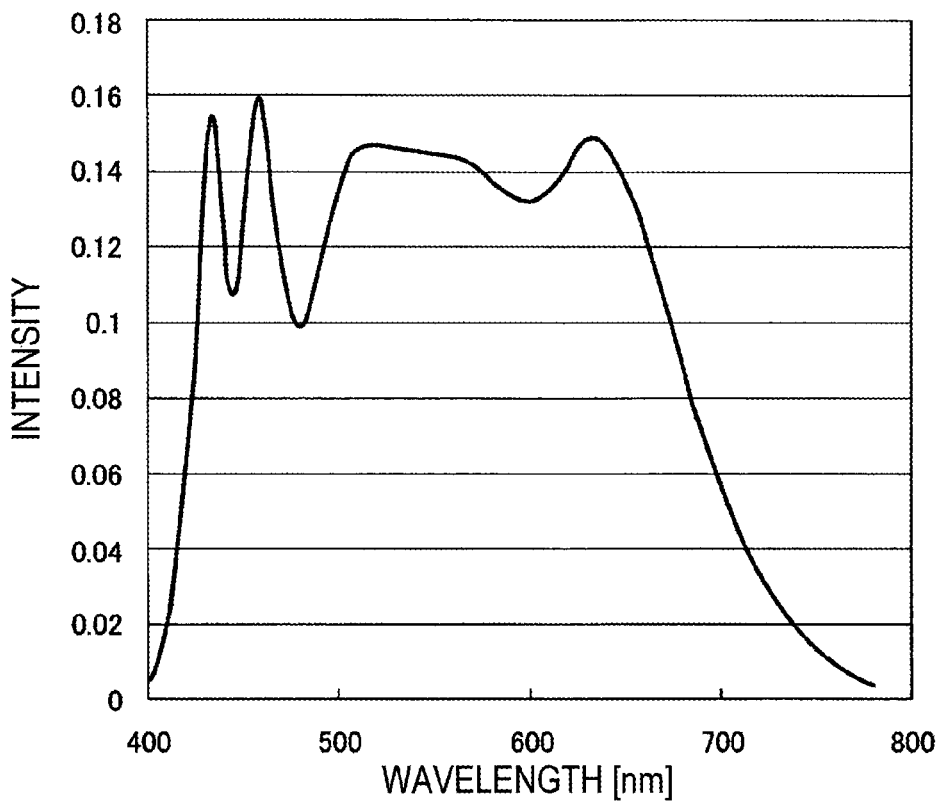
FIG. 26 illustrates another example of the emission spectrum of the output light from the light emitting device according to the second illustrative embodiment of this disclosure.
FIG. 27 is a table illustrating chromaticity of the output light from the light emitting device according to the second illustrative embodiment of this disclosure.

For example, the output light L1 shown in FIG. 24 and the output light L2 shown in FIG. 25 are combined to synthesize the output light L having a desired chromaticity 3 shown in FIG. 26. In the meantime, the peak wavelength of the first blue light emitting element 11 is shorter than the peak wavelength of the second blue light emitting element 12. The chromaticity 1 of the output light L1, the chromaticity 2 of the output light L2 and the chromaticity 3 of the output light L are exemplified in FIG. 27. As shown in FIG. 27, the high color rendering indexes of 90 or greater are obtained in the output light L.

As described above, it is possible to implement the light emitting device 1 capable of outputting the output light L of which all the color rendering indexes are high by using the two packages on which the two blue light emitting elements 10 having different peak wavelengths are respectively mounted. The other configurations are substantially the same as the first illustrative embodiment, and the overlapping descriptions thereof are omitted.

Other Illustrative Embodiments

This disclosure has been described with reference to the illustrative embodiments. However, it should be noted that the descriptions and drawings configuring the disclosure are not to limit this disclosure. From the disclosure, it is obvious to one skilled in the art that a variety of alternative illustrative embodiments and technologies are possible.

In the above illustrative embodiments, the green fluorescent substance 21 having an asymmetric emission spectrum in which the main peak is positioned at the short wavelength-side is used. However, the green fluorescent substance 21 having an asymmetric emission spectrum in which the main peak is positioned at the long wavelength-side may also be used. In this case, the red fluorescent substance 22 having an absorption spectrum in which the main peak is positioned at the long wavelength-side is used.

As described above, this disclosure includes a variety of illustrative embodiments and the like, which are not described in the specification. Therefore, the technical scope of this disclosure is determined by the definitions in the claims reasonable from the above descriptions.

What is claimed is:

1. A light emitting device comprising:
   a first blue light emitting element and a second blue light emitting element, peak wavelengths of which are different from each other, wherein peak values of emission spectrums of the peak wavelengths are within a wavelength range of 430 nm or longer and 480 nm or shorter, and
   a fluorescent substance layer comprising:
   a green fluorescent substance, which is excited by emission lights from the first blue light emitting element and the second blue light emitting element to emit green lights having emission spectrums having a first wavelength indicating a first intensity and a second wavelength indicating a second intensity smaller than the first intensity, respectively; and
   a red fluorescent substance, which has an absorption spectrum in which absorption is less in the second wavelength than in the first wavelength and which is excited by the emission lights from the first blue light emitting element and the second blue light emitting element to emit red lights.

2. The light emitting device according to claim 1,
   wherein the emission spectrum of the green fluorescent substance has a first peak value at the first wavelength and a second peak value smaller than the first peak value at the second wavelength longer than the first wavelength.

3. The light emitting device according to claim 2,
   wherein the green fluorescent substance is any one of $Ca_3(Sc, Mg)_2Si_3O_{12}:Ce^{3+}$, $Ca_3Sc_2Si_3O_{12}:Ce^{3+}$ and $CaSc_2O_4:Ce^{3+}$ activated by $Ce^{3+}$.

4. The light emitting device according to claim 1,
   wherein the red fluorescent substance is any one of $CaAlSiN_3:Eu^{2+}$ and $(Sr, Ca)AlSiN_3:Eu^{2+}$ activated by $Eu^{2+}$.

5. The light emitting device according to claim 1,
   wherein a difference between the peak wavelengths of the first blue light emitting element and the second blue light emitting element is 16 nm or greater, and
   wherein a ratio between an output of the first blue light emitting element to an output of the second blue light emitting element is 0.5 or greater and 2 or smaller.

\* \* \* \* \*